United States Patent
Park et al.

(10) Patent No.: US 8,958,011 B2
(45) Date of Patent: Feb. 17, 2015

(54) BI-DIRECTIONAL CAMERA MODULE AND FLIP CHIP BONDER INCLUDING THE SAME

(71) Applicant: Samsung Electronics Co., Ltd., Suwon-Si, Gyeonggi-Do (KR)

(72) Inventors: Sang-Sick Park, Seoul (KR); Myung-Sung Kang, Hwaseong-si (KR); Ji-Seok Hong, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 91 days.

(21) Appl. No.: 13/828,618

(22) Filed: Mar. 14, 2013

(65) Prior Publication Data

US 2013/0258188 A1 Oct. 3, 2013

(30) Foreign Application Priority Data

Mar. 30, 2012 (KR) .......... 10-2012-0033566

(51) Int. Cl.
| | |
|---|---|
| H04N 5/225 | (2006.01) |
| H04N 5/232 | (2006.01) |
| G03B 13/00 | (2006.01) |
| H04N 9/04 | (2006.01) |
| H01J 7/24 | (2006.01) |
| H01J 40/14 | (2006.01) |
| H01L 31/0232 | (2014.01) |
| H01L 31/0203 | (2014.01) |
| H01L 21/00 | (2006.01) |
| H01L 31/00 | (2006.01) |
| H01L 27/146 | (2006.01) |

(52) U.S. Cl.
CPC ........ H04N 5/2251 (2013.01); H01L 27/14618 (2013.01); H01L 27/14625 (2013.01); H04N 5/2257 (2013.01)

USPC ...... 348/374; 348/375; 348/355; 348/207.99; 250/238; 257/466; 257/432; 257/433; 257/447; 257/460

(58) Field of Classification Search
CPC ... G03B 21/16; H04N 9/3141; H04N 9/3144; G03F 7/70825
USPC .......... 348/373–376, 355, 207.99; 250/200–239; 257/428–466
See application file for complete search history.

(56) References Cited

U.S. PATENT DOCUMENTS 4,280,625 A * 7/1981 Grobbelaar et al. .......... 209/582
5,155,358 A * 10/1992 Larson .......... 250/238
(Continued)

FOREIGN PATENT DOCUMENTS

| JP | 2000-269242 A | 9/2000 |
| JP | 2002-009112 A | 1/2002 |

(Continued)

*Primary Examiner* — Chia-Wei A Chen
(74) *Attorney, Agent, or Firm* — Harness, Dickey & Pierce, P.L.C.

(57) ABSTRACT

Bi-directional camera modules and flip chip bonders including the same are provided. The module includes a circuit board on which an upper sensor and a lower sensor are mounted, an upper lens and a lower lens disposed on the upper sensor and under the lower sensor, respectively, and a housing fixing the upper lens and the lower lens spaced apart from the upper sensor and the lower sensor, respectively. The housing surrounds the circuit board. The housing has a plurality of inlets and an outlet through which air flows, and the housing has an air passage connected from the inlets to the outlet via a space between lower lens and the lower sensor.

15 Claims, 3 Drawing Sheets

(56) References Cited

U.S. PATENT DOCUMENTS

| | | | |
|---|---|---|---|
| 5,200,604 A * | 4/1993 | Rudko et al. | 250/205 |
| 5,501,388 A | 3/1996 | Takeuchi | |
| 5,900,106 A | 5/1999 | Takahashi et al. | |
| 6,793,416 B2 * | 9/2004 | Peterson et al. | 396/427 |
| 7,476,607 B2 * | 1/2009 | Yamada et al. | 438/609 |
| 8,009,979 B2 * | 8/2011 | Shirono | 396/535 |
| 8,358,928 B2 * | 1/2013 | Appel et al. | 396/535 |
| 2002/0109826 A1 * | 8/2002 | Akagawa et al. | 355/53 |
| 2005/0116138 A1 * | 6/2005 | Hanada et al. | 250/206 |
| 2006/0198150 A1 * | 9/2006 | Kinoshita et al. | 362/373 |
| 2007/0051057 A1 * | 3/2007 | Zakoji et al. | 52/171.3 |
| 2007/0115438 A1 * | 5/2007 | Tsubura | 353/57 |
| 2007/0121082 A1 * | 5/2007 | Fuse et al. | 353/58 |
| 2007/0182934 A1 * | 8/2007 | Noda et al. | 353/57 |
| 2008/0044174 A1 * | 2/2008 | Kleverman | 396/529 |
| 2008/0252975 A1 * | 10/2008 | Nishizawa | 359/511 |
| 2008/0315090 A1 * | 12/2008 | Nakasuji et al. | 250/306 |
| 2008/0319266 A1 * | 12/2008 | Poll et al. | 600/157 |
| 2009/0051829 A1 * | 2/2009 | Nagahata et al. | 348/789 |
| 2009/0124158 A1 * | 5/2009 | Hwang | 445/24 |
| 2011/0005030 A1 * | 1/2011 | Shirono | 15/363 |
| 2011/0249965 A1 * | 10/2011 | Appel et al. | 396/448 |
| 2012/0069238 A1 * | 3/2012 | Toyomura et al. | 348/340 |
| 2012/0070142 A1 * | 3/2012 | Tregnago et al. | 396/419 |
| 2012/0105958 A1 * | 5/2012 | Soyez et al. | 359/507 |

FOREIGN PATENT DOCUMENTS

| | | |
|---|---|---|
| JP | 2009-253185 A | 10/2009 |
| JP | 2010-010547 A | 1/2010 |
| KR | 20060019883 A | 3/2006 |
| KR | 100642323 B1 | 10/2006 |

* cited by examiner

BI-DIRECTIONAL CAMERA MODULE AND FLIP CHIP BONDER INCLUDING THE SAME

CROSS-REFERENCE TO RELATED APPLICATIONS

This U.S. non-provisional patent application claims priority under 35 U.S.C. §119 to Korean Patent Application No. 10-2012-0033566, filed on Mar. 30, 2012, the entirety of which is incorporated by reference herein.

BACKGROUND

Example embodiments of inventive concepts relate to semiconductor manufacturing apparatuses, for example, to bi-directional camera modules for aligning a flip chip with a substrate, and/or flip chip bonders including the same.

Generally, a flip chip bonder may mount a flip chip on a substrate. The flip chip bonder may include a stage supporting the substrate, a head loading the flip chip over the stage, and an optical device detecting position information of the flip chip and the substrate. The substrate may be heated at a high temperature by a heater disposed on the stage. The head and the optical device may be able to be moved by a driving part. The optical device may include a bi-directional camera module, which is inserted between the head and the stage so as to recognize the flip chip and the substrate. The bi-directional camera module may provide image information of fiducial marks (or alternatively, alignment marks) respectively formed on the flip chip and the substrate. However, a conventional bi-directional camera module may be heated by the heater, thereby causing misalignment of the flip chip with respect to the substrate.

SUMMARY

Example embodiments of the inventive concepts may provide bi-directional camera modules capable of maintaining a substantially constant temperature or a desired temperature range and flip chip bonders including the same.

Example embodiments of the inventive concepts may also provide bi-directional camera modules capable of preventing or reducing misalignment of a flip chip and a substrate and flip chip bonders including the same.

Example embodiments of the inventive concepts may also provide bi-directional camera modules capable of improving production yield and flip chip bonders including the same.

According to example embodiments, a bi-directional camera module may include a circuit board on which an upper sensor and a lower sensor are mounted, an upper lens and a lower lens disposed on the upper sensor and under the lower sensor, respectively, and a housing holding the upper lens and the lower lens spaced apart from the upper sensor and the lower sensor, respectively, the housing surrounding the circuit board. The housing may have at least one inlet and an outlet through which air flows, and the housing may have an air passage connected from the at least one inlet to the outlet via a space between lower lens and the lower sensor.

According to example embodiments, the air passage may be defined between the circuit board and an inner bottom of the housing.

According to example embodiments, the air passage may have a planar area greater than that of the lower lens.

According to example embodiments, the at least one inlet and the outlet may be disposed in the housing adjacent to opposite sides of the lower lens, respectively.

According to example embodiments, the bi-directional camera module may further include a temperature sensor disposed in the housing around the lower lens.

According to example embodiments, the temperature sensor may include a thermocouple.

According to example embodiments, a flip chip bonder may include a stage, a heater disposed on the stage, a guide frame adjacent to the stage, a first guide moving part configured to move along the guide frame, a bonding head configured to move onto the heater by the first guide moving part, a second guide moving part separated from the first guide moving part, the second guide moving part configured to move along the guide frame, and a bi-directional camera module loaded between the bonding head and the heater by the second guide moving part. The bi-directional camera module may include a circuit board on which an upper sensor and a lower sensor are mounted, an upper lens and a lower lens disposed on the upper sensor and under the lower sensor, respectively, and a housing holding the upper lens and the lower lens spaced apart from the upper sensor and the lower sensor, respectively, the housing surrounding the circuit board. The housing may have at least one inlet and an outlet through which air flows; and the housing may have an air passage connected from the at least one inlet to the outlet via a space between lower lens and the lower sensor.

According to example embodiments, the flip chip bonder may further include an air circulator configured to circulate a cooling air and/or a warm air into the air passage of the bi-directional camera module.

According to example embodiments, the air circulator may include a cooling air supplying part and a warm air supplying part supplying the cooling air and the warm air to the bi-directional camera module, respectively, and an air exhaust part exhausting the cooling air and/or the warm air.

According to example embodiments, the flip chip bonder may further include supplying lines and an exhaust line connected between the air circulator and the bi-directional camera module.

According to example embodiments, the at least one inlet of the housing may include a first inlet and a second inlet respectively connected to the cooling air supplying part and the warm air supplying part by the supplying lines.

According to example embodiments, the first inlet, the second inlet, and the outlet may be connected to the housing between the circuit board and an inner bottom of the housing.

According to example embodiments, the first inlet and the second inlet may be adjacent to one side of the lower lens; and the outlet may be adjacent to another side of the lower lens.

According to example embodiments, the supplying lines and the exhaust line may extend along the second guide moving part.

According to example embodiments, the bi-directional camera module may further include a temperature sensor disposed in the housing around the lower lens.

According to example embodiments, a bi-directional camera module for aligning a flip chip with a substrate includes a housing, a printed circuit board (PCB) in the housing, a first sensor coupled to a top surface of the PCB, the first sensor configured to detect a fiducial mark of the flip chip, a second sensor coupled to a bottom surface of the PCB, the second sensor configured to detect a fiducial mark of the substrate, a first lens over the first sensor, the first lens held by the housing at least at two opposite sides thereof, the first lens enlarging a surface image of the flip chip, a second lens under the second sensor, the second lens held by the housing at least at two opposite sides thereof, the second lens enlarging a surface image of the substrate, and an air circulator configured to supply a cooling air or a warm air, the air circulator configured to maintain the second lens at a substantially constant temperature or within a desired temperature range.

According to example embodiments, the air circulator may include an inlet configured to supply the cooling air or the warm air, and an outlet configured to recover the temperature control air.

According to example embodiments, the inlet and outlet are disposed in the housing adjacent to opposite sides of the second lens, respectively.

According to example embodiments, the housing provides an air passage area between the inlet and the outlet. The air passage area is defined by the second sensor and the second lens in a second direction, which is perpendicular to a first direction from the inlet to the outlet.

According to example embodiments, the air passage area has a planar area greater than the second lens.

BRIEF DESCRIPTION OF THE DRAWINGS

Example embodiments will become more apparent in view of the attached drawings and accompanying detailed description.

FIG. 1 is a perspective view illustrating a flip chip bonder according to example embodiments;

FIG. 2 is a schematic plan view illustrating a bi-directional camera module of FIG. 1;

FIG. 3 is a cross-sectional view illustrating the bi-directional camera module of FIG. 1; and FIG. 4 is a graph illustrating alignment accuracy between a substrate and a flip chip according to a temperature variation of a lower lens.

Figure 1:
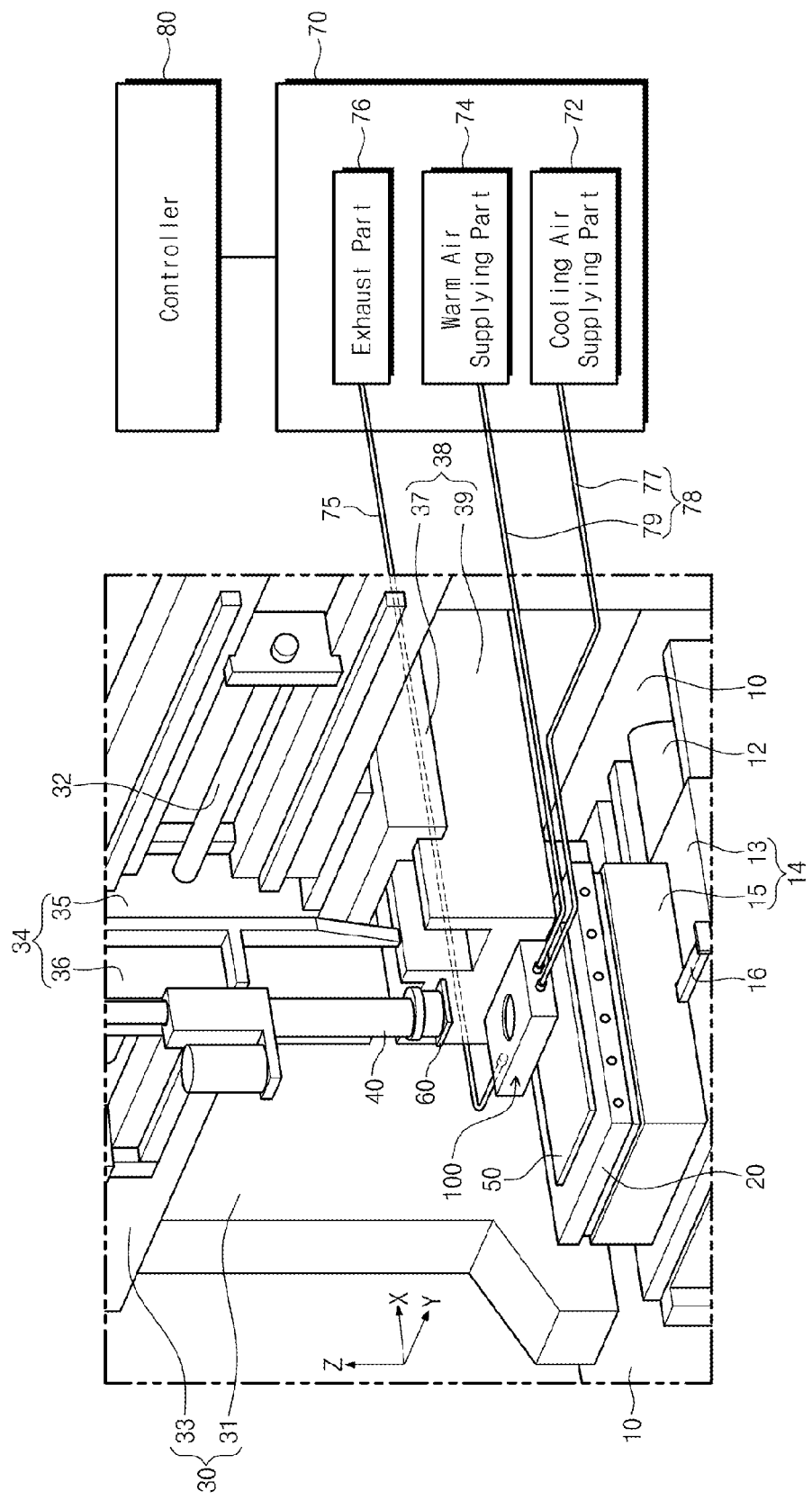
FIGS. 1-4 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully hereinafter with reference to the accompanying drawings. The advantages and features of the inventive concepts will be apparent from the following example embodiments that will be described in more detail with reference to the accompanying drawings. It should be noted, however, that the inventive concepts are not limited to the following example embodiments, and may be implemented in various forms. Accordingly, example embodiments are provided only to disclose the inventive concepts and let those skilled in the art know the category of the inventive concepts. In the drawings, example embodiments are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal exemplary views of the inventive concepts. Accordingly, shapes of the exemplary views may be modified according to manufacturing techniques and/or allowable errors. Therefore, example embodiments are not limited to the specific shape illustrated in the specific exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts. The example embodiments explained and illustrated herein include their complementary counterparts. The same reference numerals or the same reference designators denote the same elements throughout the specification.

Moreover, example embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
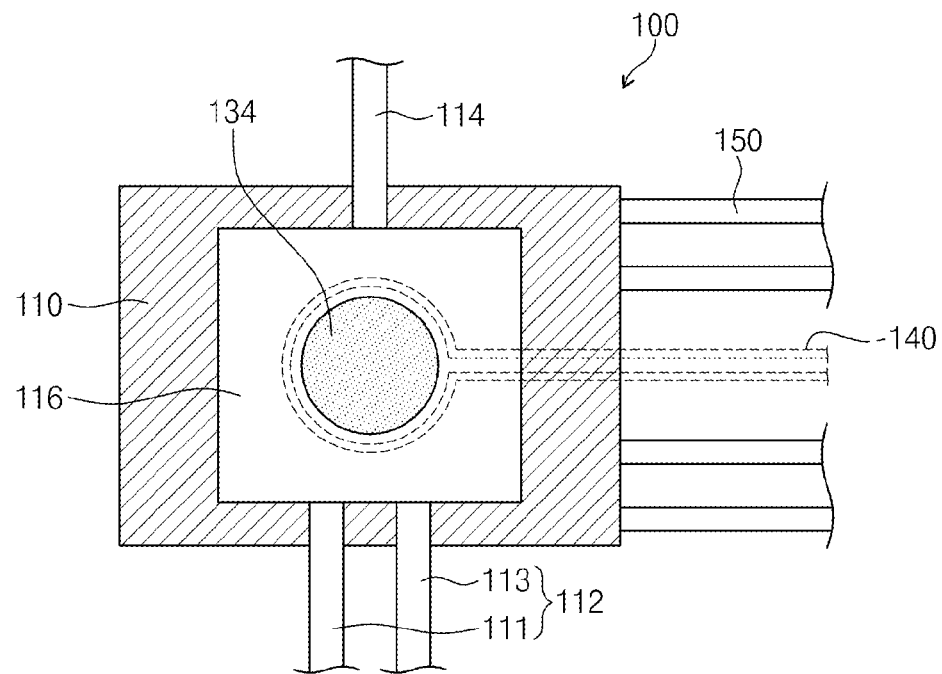
Figure 3:
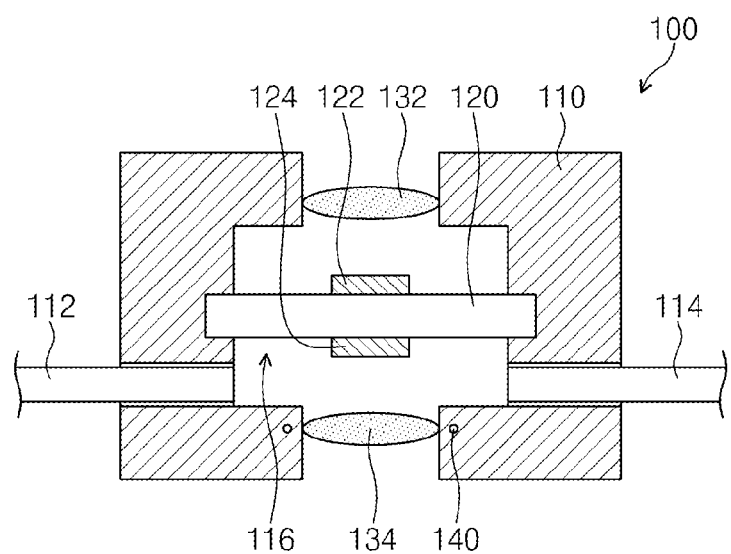

FIG. 1 is a perspective view illustrating a flip chip bonder according to example embodiments. FIG. 2 is a schematic plan view illustrating a bi-directional camera module of FIG. 1. FIG. 3 is a cross-sectional view illustrating the bi-directional camera module of FIG. 1.

Referring to FIG. 1, a flip chip bonder according to example embodiments may include a bi-directional camera module 100 may be controlled to maintain a substantially constant temperature, or to be within a desired temperature range by a cooling air and a warm air which are provided from an air circulator. Accordingly, the bi-directional camera module 100 may prevent or reduce misalignment of a flip chip 60 and a substrate 50, which is caused by heating of a heater 20.

Thus, the flip chip bonder according to example embodiments may improve production yield.

A stage 10 may support the heater 20 and the substrate 50. Thus, the heater 20 and the substrate 50 may be horizontally disposed by the stage 10. The heater 20 may be moved by a substrate moving part 14 on the stage 10. The substrate moving part 14 may include a first X-axis moving part 13 and a first Y-axis moving part 15. The first X-axis moving part 13 may be moved along a first linear guide 12. The first Y-axis moving part 15 may be moved along a second linear guide 16. The heater 20 may heat the substrate 50 to a temperature of about 150 degrees Celsius. A guide frame 30 may be disposed around and over the stage 10.

The guide frame 30 may include vertical frames 31 and a horizontal frame 33. The vertical frames 31 may be disposed at both sides of the stage 10. The horizontal frame 33 may be disposed over a side of the stage 10. The horizontal frame 33 may be supported by the vertical frames 31. The horizontal frame 33 may include a third linear guide 32.

Each of a first guide moving part 34 and a second guide moving part 38 may be moved in parallel to the stage 10 along the horizontal frame 33. The first guide moving part 34 may move a bonding head 40. The first guide moving part 34 may include a second Y-axis moving part 35 and a second X-axis moving part 36. The second Y-axis moving part 35 may move the second X-axis moving part 36 and the bonding head 40 in a Y-axis direction along the third linear guide 32. The second X-axis moving part 36 may move the bonding head 40 in an X-axis direction along a fourth linear guide (not shown) in the second X-axis moving part 36. The bonding head 40 may pick up the flip chip 60 by a vacuum. The bonding head 40 may move the flip chip 60 in a Z-axis direction. If alignment of the flip chip 60 with respect to the substrate 50 is finished by the bi-directional camera module 100, the flip chip 60 may be bonded to the substrate 50 by the bonding head 40.

The second guide moving part 38 may move the bi-directional camera module 100 in horizontal directions. The second guide moving part 38 may include a third Y-axis moving part 37 and a third X-axis moving part 39. The third Y-axis moving part 37 may move the third X-axis moving part 39 and the bi-directional camera module 100 in the Y-axis direction along a bottom surface of the horizontal frame 33 under the second Y-axis moving part 35. The third X-axis moving part 39 may move the bi-directional camera module 100 in the X-axis direction along the third Y-axis moving part 37.

The bi-directional camera module 100 may be moved over the heater 20 by the second guide moving part 38. The bi-directional camera module 100 may be moved outside the bonding head 40 by the second guide moving part 38 when the flip chip 60 is bonded to the substrate 50. The bi-directional camera module 100 may be moved between the bonding head 40 and the heater 20 to recognize fiducial marks of the flip chip 60 and the substrate 50. As described above, the bi-directional camera module 100 may be controlled to maintain a substantially constant temperature or to be within a desired temperature range by the air circulator 70.

The air circulator 70 may circulate the cooling air and the warm air to the bi-directional camera module 100. The air circulator 70 may include a cooling air supplying part 72 supplying the cooling air, a warm air supplying part 74 supplying the warm air, and an air exhaust part 76 exhausting the cooling air and the warm air. The air circulator 70 and the bi-directional camera module 100 may be connected to each other by supplying lines 78 and an exhaust line 75. The supplying lines 78 and the exhaust line 75 may extend along the third X-axis moving part 39 and the third Y-axis moving part 37 of the second guide moving part 38. The supplying lines 78 may include a first supplying line 77 connected from the bi-directional camera module 100 to the cooling air supplying part 72, and a second supplying line 79 connected from the bi-directional camera module 100 to the warm air supplying part 74.

Thus, the flip chip bonder according to example embodiments may keep the bi-directional camera module 100 at a substantially constant temperature or within a desired temperature range.

FIGS. 2 and 3 are a plan view and a cross-sectional view, respectively, illustrating the bi-directional camera module 100 in more detail.

Referring to FIGS. 1 to 3, the bi-directional camera module 100 may include a housing 110, a printed circuit board (PCB) 120 in the housing 110, an upper lens 132 over the PCB 120, a lower lens 134 under the PCB 120, and a temperature sensor 140 around the lower lens 134.

An upper sensor 122 and a lower sensor 124 may be mounted on the PCB 120. The PCB 120 may be connected to support bars 150. Power lead-in wires (not shown) may be disposed in the support bars 150 to extend to the outside of the housing 110. The PCB 120 may input/output image signals of the upper sensor 122 and the lower sensor 124 through the power lead-in wires. The support bars 150 may be combined with the third X-axis moving part 39. The upper sensor 122 may detect the fiducial mark of the flip chip 60. The lower sensor 124 may detect the fiducial mark of the substrate 50. Each of the upper and lower sensors 122 and 124 may be a CMOS image sensor (CIS) or a charge coupled device (CCD).

A surface image of the flip chip 60 may be enlarged by the upper lens 132 and then the enlarged surface image of the flip chip 60 may be provided to the upper sensor 122. A surface image of the substrate 50 may be enlarged by the lower lens 134 and then the enlarged surface image of the substrate 50 may be provided to the lower sensor 124. The temperature sensor 140 may be disposed in the housing 110 around the lower lens 134. The temperature sensor 140 may include a thermocouple sensing a temperature of the lower lens 134. The lower lens 134 may be thermally expanded by radiation or convective heat of the heater 20.

Figure 4:
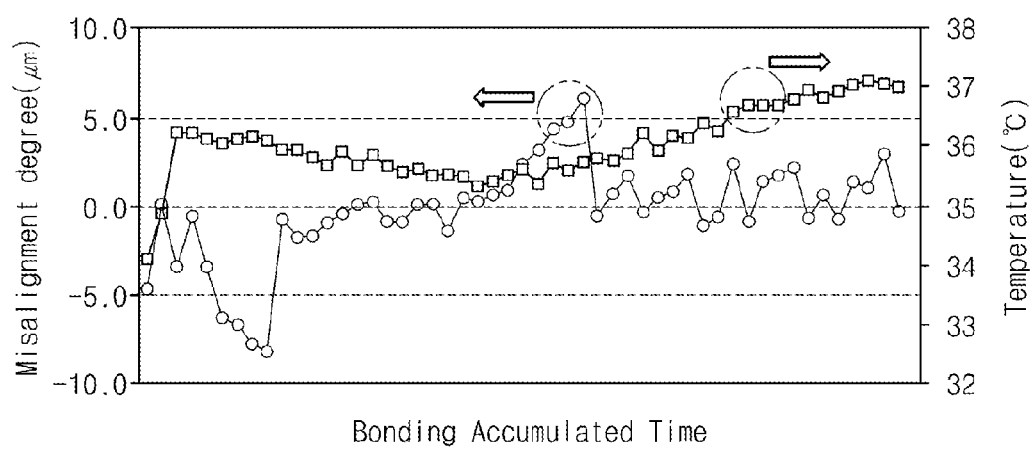

FIG. 4 is a graph illustrating a misalignment degree between the substrate 50 and the flip chip 60 according to a temperature variation of the lower lens 134. When the temperature of the lower lens 134 increases, the misalignment between the substrate 50 and the flip chip 60 tends to increase. The lower lens 134 may be heated to a temperature higher than a room temperature. The lower lens 134 may be expanded or shrunken by a temperature variation. The bi-directional camera module 100 may cause a bad image of the substrate 100 by the expansion or the shrinkage of the lower lens 134. Accordingly, the misalignment between the substrate 50 and the flip chip 60 may be increased or decreased.

According to example embodiments, the lower lens 134 may be cooled by the cooling air circulating through a first inlet 111 and an outlet 114. The lower lens 134 may be controlled to maintain a substantially constant temperature or to be within a desired temperature range by the air circulator 70 and the temperature sensor 140. A controller 80 may control the air circulator 70 in response to a temperature sensing signal of the temperature sensor 140. If the lower lens 134 is over-cooled outside the heater 20, the lower lens 134 may be heated, by the warm air of the warm air supplying part 74, to the desired temperature or the desired temperature range. If the lower lens 134 is over-heated over the heater 20, the lower lens 134 may be cooled, by the cooling air of the cooling air supplying part 72, to the desired constant temperature or the desired temperature range. For example, the lower lens 134 may maintain a temperature within a range of about 20 degrees Celsius to about 23 degrees Celsius. Thus, it is possible to prevent or minimize the expansion or the shrinkage of the lower lens 134.

The housing 110 may surround the PCB 120. The housing 110 may hold the upper lens 132 and the lower lens 134 in the state that the upper and lower lenses 132 and 134 are spaced apart from the PCB 120. The housing 110 may have inlets 112 and the outlet 114. The inlets 112 may include the first inlet 111 through which the cooling air flows and a second inlet 113 through which the warm air flows. The inlets 112 and the outlet 114 may be disposed in the housing 110 adjacent to opposite sides of the lower lens 134, respectively. The first inlet 111 and the second inlet 113 may be adjacent to one side of the lower lens 134, and the outlet 114 may be adjacent to another side of the lower lens 134.

The housing 110 may provide an air passage area 116 connected from the inlets 112 to the outlet 114 via a space between the lower sensor 124 and the lower lens 134. The air passage area 116 may be defined between the PCB 120 and an inner bottom of the housing 110. Additionally, the inlets 112 and the outlet 114 may be disposed at a level between the PCB 120 and the inner bottom of the housing 110. The air passage area 116 may have a planar area greater than that of the lower lens 134. The lower lens 134 may be exposed to the cooling air or the warm air in the air passage area 116. Thus, the bi-directional camera module 100 is controlled to maintain the substantially constant temperature or to be within the desired temperature range, so that the misalignment between the substrate 50 and the flip chip 60 may be minimized or prevented. As a result, the flip chip bonder according to example embodiments may improve production yield.

According to example embodiments, the bi-directional camera module may include the housing including the air passage between the lower lens and the lower sensor. The cooling air and the warm air pass through the air passage. Thus, the lower lens may maintain a substantially constant temperature or be within a desired temperature range. The bi-directional camera module may prevent or minimize the misalignment between the substrate and the flip chip caused by thermal expansion of the lower lens. As a result, the bi-directional camera module according to the aforementioned embodiments may improve production yield.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A bi-directional camera module comprising:
   a circuit board on which an upper sensor and a lower sensor are mounted;
   an upper lens and a lower lens on the upper sensor and under the lower sensor, respectively; and
   a housing holding the upper lens and the lower lens spaced apart from the upper sensor and the lower sensor, respectively, the housing surrounding the circuit board,
   wherein the housing has at least one inlet and an outlet through which air flows; and
   wherein the housing has an air passage connected from the at least one inlet to the outlet via a space between lower lens and the lower sensor.

2. The bi-directional camera module of claim 1, wherein the air passage is defined between the circuit board and an inner bottom of the housing.

3. The bi-directional camera module of claim 1, wherein the air passage has a planar area greater than that of the lower lens.

4. The bi-directional camera module of claim 1, wherein the at least one inlet and the outlet are disposed in the housing adjacent to opposite sides of the lower lens, respectively.

5. The bi-directional camera module of claim 1, further comprising:
   a temperature sensor in the housing around the lower lens.

6. The bi-directional camera module of claim 5, wherein the temperature sensor includes a thermocouple.

7. A flip chip bonder comprising:
   a stage;
   a heater on the stage;
   a guide frame adjacent to the stage;
   a first guide moving part configured to move along the guide frame;
   a bonding head configured to move onto the heater by the first guide moving part;
   a second guide moving part separated from the first guide moving part, the second guide moving part configured to move along the guide frame; and
   a bi-directional camera module between the bonding head and the heater by the second guide moving part, wherein the bi-directional camera module includes:
   a circuit board on which an upper sensor and a lower sensor are mounted;
   an upper lens and a lower lens on the upper sensor and under the lower sensor, respectively; and
   a housing holding the upper lens and the lower lens spaced apart from the upper sensor and the lower sensor, respectively, the housing surrounding the circuit board;
   wherein the housing has at least one inlet and an outlet through which air flows; and
   wherein the housing has an air passage connected from the at least one inlet to the outlet via a space between lower lens and the lower sensor.

8. The flip chip bonder of claim 7, further comprising:
   an air circulator configured to circulate a cooling air and/or a warm air into the air passage of the bi-directional camera module.

9. The flip chip bonder of claim 8, wherein the air circulator comprises:
   a cooling air supplying part and a warm air supplying part supplying the cooling air and the warm air to the bi-directional camera module, respectively; and
   an air exhaust part exhausting the cooling air and/or the warm air.

10. The flip chip bonder of claim 9, further comprising:
    supplying lines and an exhaust line connected between the air circulator and the bi-directional camera module.

11. The flip chip bonder of claim 10, wherein the at least one inlet of the housing include a first inlet and a second inlet respectively connected to the cooling air supplying part and the warm air supplying part by the supplying lines.

12. The flip chip bonder of claim 11, wherein the first inlet, the second inlet, and the outlet are connected to the housing between the circuit board and an inner bottom of the housing.

13. The flip chip bonder of claim 12, wherein the first inlet and the second inlet are adjacent to one side of the lower lens; and wherein the outlet is adjacent to another side of the lower lens.

14. The flip chip bonder of claim 10, wherein the supplying lines and the exhaust line extend along the second guide moving part.

15. The flip chip bonder of claim 7, wherein the bi-directional camera module further comprises:

a temperature sensor in the housing around the lower lens.

* * * * *